(12) United States Patent
Kim

(10) Patent No.: US 10,115,569 B2
(45) Date of Patent: Oct. 30, 2018

(54) PLASMA GENERATOR

(71) Applicant: JEHARA CORPORATION, Gyeonggi-do (KR)

(72) Inventor: Hongseub Kim, Gyeonggi-do (KR)

(73) Assignee: JEHARA CORPORATION, Gyeonggi-Do (KR)

(*) Notice: Subject to any disclaimer, the term of this patent is extended or adjusted under 35 U.S.C. 154(b) by 0 days.

(21) Appl. No.: 15/487,985

(22) Filed: Apr. 14, 2017

(65) Prior Publication Data

US 2017/0372875 A1 Dec. 28, 2017

(30) Foreign Application Priority Data

Jun. 24, 2016 (KR) .................... 10-2016-0079451

(51) Int. Cl.
*H01J 7/24* (2006.01)
*H05B 31/26* (2006.01)
*H01J 37/32* (2006.01)

(52) U.S. Cl.
CPC ...... *H01J 37/32568* (2013.01); *H01J 37/321* (2013.01); *H01J 37/3211* (2013.01); *H01J 37/32183* (2013.01); *H01J 37/32577* (2013.01)

(58) Field of Classification Search
None
See application file for complete search history.

(56) References Cited

U.S. PATENT DOCUMENTS

| | | | | |
|---|---|---|---|---|
| 8,334,657 B2* | 12/2012 | Xia | .................... | H01J 37/32082 315/111.51 |
| 2006/0105114 A1* | 5/2006 | White | ...................... | C23C 8/36 427/569 |
| 2009/0159423 A1* | 6/2009 | Kudela | ............. | H01J 37/32091 204/157.44 |

FOREIGN PATENT DOCUMENTS

| | | |
|---|---|---|
| KR | 10-2002-0020324 A | 3/2002 |
| KR | 10-2006-0046381 A | 5/2006 |
| KR | 1020100127353 A | 12/2010 |
| KR | 10-2011-0041541 A | 4/2011 |
| WO | 2010/011521 A2 | 1/2010 |

* cited by examiner

*Primary Examiner* — Anh Tran
(74) *Attorney, Agent, or Firm* — HoustonHogle LLP

(57) ABSTRACT

Provided is a plasma generator for improving uniformity of plasma. The plasma generator which includes a pair of source electrode unit 110 and bias electrode unit 120 disposed to face each other in a vacuum chamber and an RF power unit 132 and a bias RF power unit 142 supplying RF power to the source electrode unit 110 and the bias electrode unit 120, respectively, comprises a common contact point cc which is connected with a plurality of contact points cp disposed along the edge of the source electrode unit 110; and an impedance controller 150 which is connected with the common contact point cc to control the impedance.

14 Claims, 15 Drawing Sheets

PLASMA GENERATOR

RELATED APPLICATIONS

This application claims the priority of Korean Patent Application No. 10-2016-0079451 filed on Jun. 24, 2016, in the Korean Intellectual Property Office, the disclosure of which is incorporated herein by reference.

BACKGROUND OF THE INVENTION

Field of the Invention

The present invention relates to a plasma generator for improving uniformity of plasma used in a semiconductor manufacturing process and the like.

Description of the Related Art

Plasma is the fourth material other than solid, liquid, and gas and gas of which a part is ionized, and consists of neutral particles, ions, and electrons. However, although ions and electrons are simply gathered, it is not defined as plasma, and to be in a plasma state, first, a sufficient number of "ion-electron" pairs needs to be present in a given system to enable statistic processing, and second, the whole system needs to be electrically neutralized when macroscopically viewed. Accordingly, in a general neutral gas system, the plasma has a collective behavior characteristic.

Referring to FIG. 1, in a plasma generator in the related art, two flat electrodes constituted by a source electrode 11 and a susceptor 12 are vertically installed in a vacuum chamber 10 to be spaced apart from each other at a predetermined interval, the source electrode 11 is connected with an RF power unit 21, and the suspector 12 is connected with a bias RF power unit 31. Reference numerals 22 and 32 represent impedance matching units for optimizing and transferring RF power applied to the source electrode 11 and the susceptor 12 from the RF power unit 21 and the bias RF power unit 31, respectively.

In the plasma generator configured as such, the substrate 1 is positioned on the upper surface of the suspector 12, the RF power is applied to the source electrode 11 and the susceptor 12 from the outside, and a strong electromagnetic field is formed between the source electrode 11 and the susceptor 12, and as a result, plasma PS is generated in the vacuum chamber 10. The plasma generated as such is used for deposition, etching, or the like in a semiconductor manufacturing apparatus, an LCD apparatus, or a solar cell manufacturing apparatus.

Meanwhile, recently, the size of the substrate tends to be increased, and as a result, the size of an antenna for generating the plasma needs to be also increased. However, since a planar antenna as the source electrode unit 11 is floated, a boundary condition is not established, and as a result, the uniformity of an electric field is decreased between the center and the edge of the source electrode 11, and thus as illustrated in FIG. 2, RF power transferred to the edge of the source electrode is decreased. The nonuniformity of the electromagnetic field causes a standing wave effect and thus, there is a problem in that the uniformity of the plasma generated at the edge of the planar antenna is decreased.

In order to improve the problem, in Korean Patent Registration No. 10-1091556 (issued date: Dec. 13, 2011), the present applicant proposes a large-area plasma source apparatus capable of improving uniformity of the plasma generated in the vacuum chamber. In the plasma source apparatus, a plurality of impedance boxes is provided on the outer circumference surface of a source electrode unit for generating the plasma by electrostatic coupling to control impedance values in the respective impedance boxes.

The present invention is filed by continuously researching and improving the plasma generator for generating the plasma by electrostatic coupling and creating the plasma generator capable of increasing the uniformity of the plasma.

SUMMARY OF THE INVENTION

In order to solve the above-mentioned problems, an aspect of the present invention provides a plasma generator capable of improving uniformity of plasma used in a semiconductor manufacturing process and the like and easily controlling distribution of the plasma.

According to an aspect of the present invention, there is provided a plasma generator which includes pair of source electrode unit and bias electrode unit disposed to face each other in a vacuum chamber and an RF power unit and a bias RF power unit supplying RF power to the source electrode unit and the bias electrode unit, respectively, including: a common contact point which is connected with a plurality of contact points disposed along the edge of the source electrode unit; and an impedance controller which is connected with the common contact point to control the impedance.

Preferably, the RF power unit may be connected by a power contact point positioned at a geometric center or an electromagnetic impedance center of the source electrode unit.

Preferably, the bias electrode unit may further include a second common contact point which is connected with the plurality of second group contact points disposed along the edge; and a second impedance controller which is connected with the second common contact point to control the impedance.

According to another aspect of the present invention, there is provided a plasma generator including a pair of source electrode unit and bias electrode unit disposed to face each other in a vacuum chamber and an RF power unit and a bias RF power unit supplying RF power to the source electrode unit and the bias electrode unit, respectively, in which the source electrode is inductive coupled plasma, and in the bias electrode unit, a plurality of contact points is disposed along the edge, and the contact points are connected to a common contact point to be connected with an impedance controller controlling the impedance.

Preferably, the bias RF power unit may be connected by a power contact point positioned at a geometric center of the bias electrode unit.

Preferably, the contact points may be disposed to be rotatably symmetric to the geometric center of the source electrode unit.

According to yet another aspect of the present invention, there is provided a plasma generator which includes a pair of source electrode unit and bias electrode unit disposed to face each other in a vacuum chamber and an RF power unit and a bias RF power unit supplying RF power to the source electrode unit and the bias electrode unit, respectively, the plasma generator including: a planar capacitor provided with a predetermined width along the edge of the source electrode unit; and an impedance controller which is connected with the planar capacitor by the contact point to control the impedance.

Preferably, the bias electrode unit may further include a second planar capacitor provided with a predetermined width along the edge, and a second impedance controller which is connected with the second planar capacitor to control the impedance.

According to still another aspect of the present invention, there is provided a plasma generator including a pair of source electrode unit and bias electrode unit disposed to face each other in a vacuum chamber and an RF power unit and a bias RF power unit supplying RF power to the source electrode unit and the bias electrode unit, respectively, in which the source electrode is inductive coupled plasma, and the bias electrode unit further includes a planar capacitor provided with a predetermined width along the edge, and an impedance controller which is connected with the planar capacitor by the contact point to control the impedance.

Preferably, the planar capacitor may include a dielectric thin film layer provided with a predetermined width along the edge of the source electrode unit and a metal layer provided on the upper surface of the dielectric thin film layer.

According to the exemplary embodiment of the present invention, in the plasma generator, in at least one or all of a pair of electrode units which face each other in a vacuum chamber, a plurality of contact points disposed along the edge is connected to one common contact point to be connected with an impedance controller or connects a planar capacitor and an impedance controller which are provided with a predetermined width along the edge of the electrode unit. Accordingly, uniformity of the plasma can be ensured only by the control of one impedance controller and further, the distribution of the plasma can be easily controlled.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Specific structural or functional descriptions presented in exemplary embodiments of the present invention are made only for the purposes of describing the exemplary embodiments according the concept of the present invention and the exemplary embodiments according the concept of the present invention may be carried out in various forms. Further, it should not be interpreted that the exemplary embodiments are limited to the exemplary embodiments described in the present specification and it should be understood that the present invention covers all the modifications, equivalents and replacements within the idea and technical scope of the present invention.

Meanwhile, terms such as first and/or second, and the like may be used for describing various components, but the components are not limited by the terms. The terms may be used only for distinguishing one component from other components, for example, a first component may be referred to as a second component, and similarly, a second component may be referred to as a first component within the scope without departing from the claims according to the concept of the present invention.

It should be understood that, when it is described that a component is "connected to" or "accesses" another component, the component may be directly connected to or access the other component or a third component may be present therebetween. In contrast, it should be understood that, when it is described that an element is "directly connected to" or "directly contact" another element, it is understood that no element is present between the element and another element. Meanwhile, other expressions for describing the relationship of the components, that is, "between" and "directly between" or "adjacent to" and "directly adjacent to" should be similarly analyzed.

Terms used in the present specification are used only to describe specific embodiments, and are not intended to limit the present invention. Singular expressions used herein include plural expressions unless they have definitely opposite meanings in the context. In the present specification, it should be understood that the term "include" or "have" indicates that a feature, a number, a step, an operation, a component, a part or the combination thereof which are implemented, but does not exclude a possibility of presence or addition of one or more other features, numbers, steps, operations, components, parts or combinations thereof, in advance.

Figure 1:
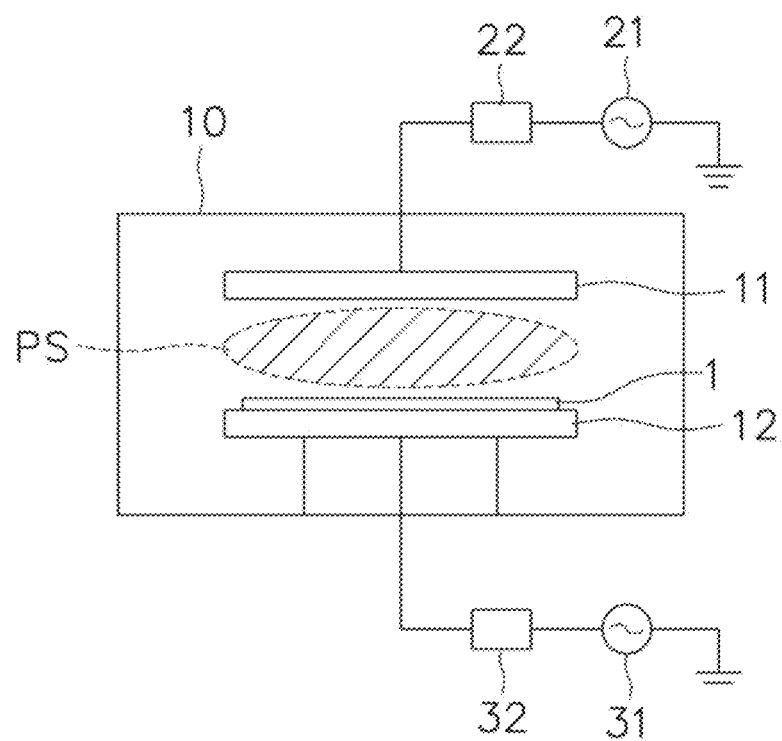
FIG. 1 is a configuration diagram of a plasma generator in the related art.
Figure 2:
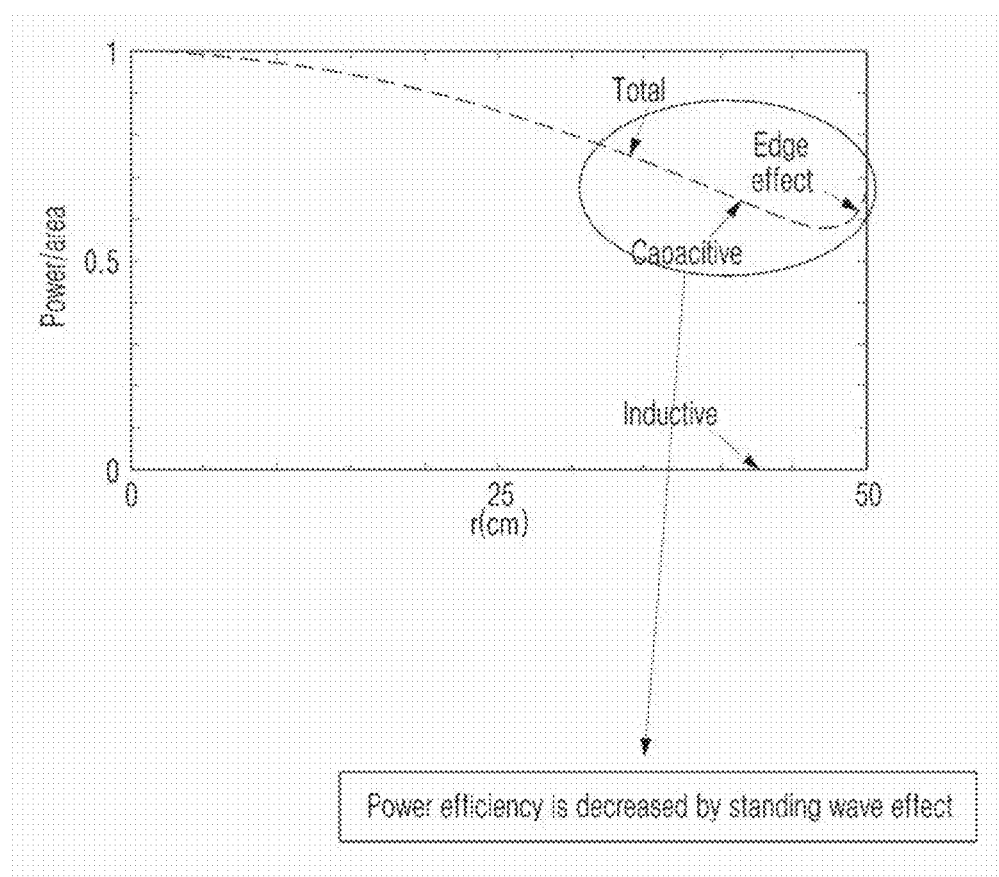
FIG. 2 is a graph illustrating a relationship between a radial distance and power per unit area of a source electrode unit.
Figure 3A:
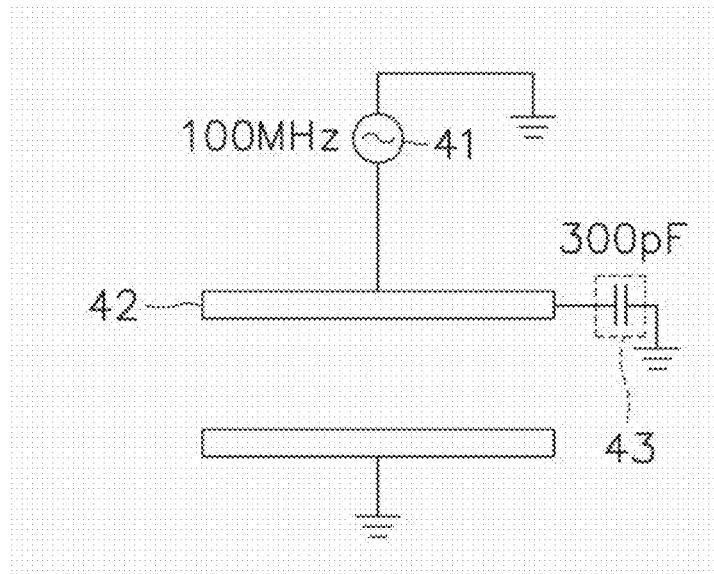
FIGS. 3A and 3B are a front configuration diagram and a plan configuration diagram of a plasma generator model for simulating an electric field intensity distribution of a source electrode unit according to a first Comparative Example, respectively.
Figure 3B:
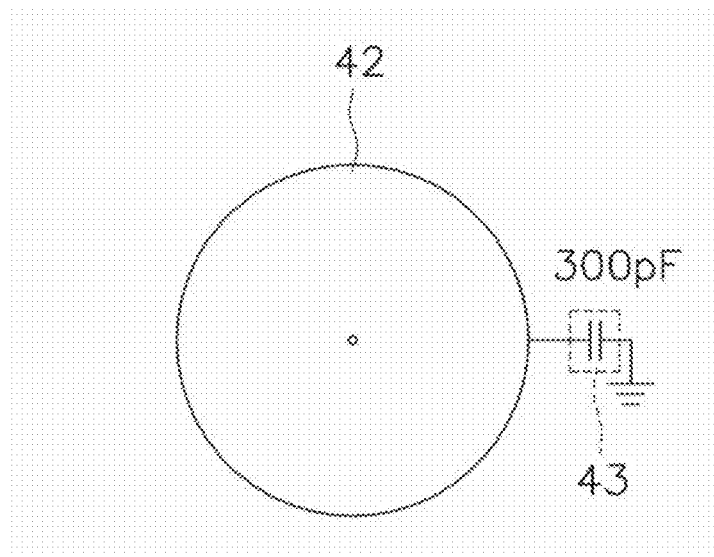
Figure 4:
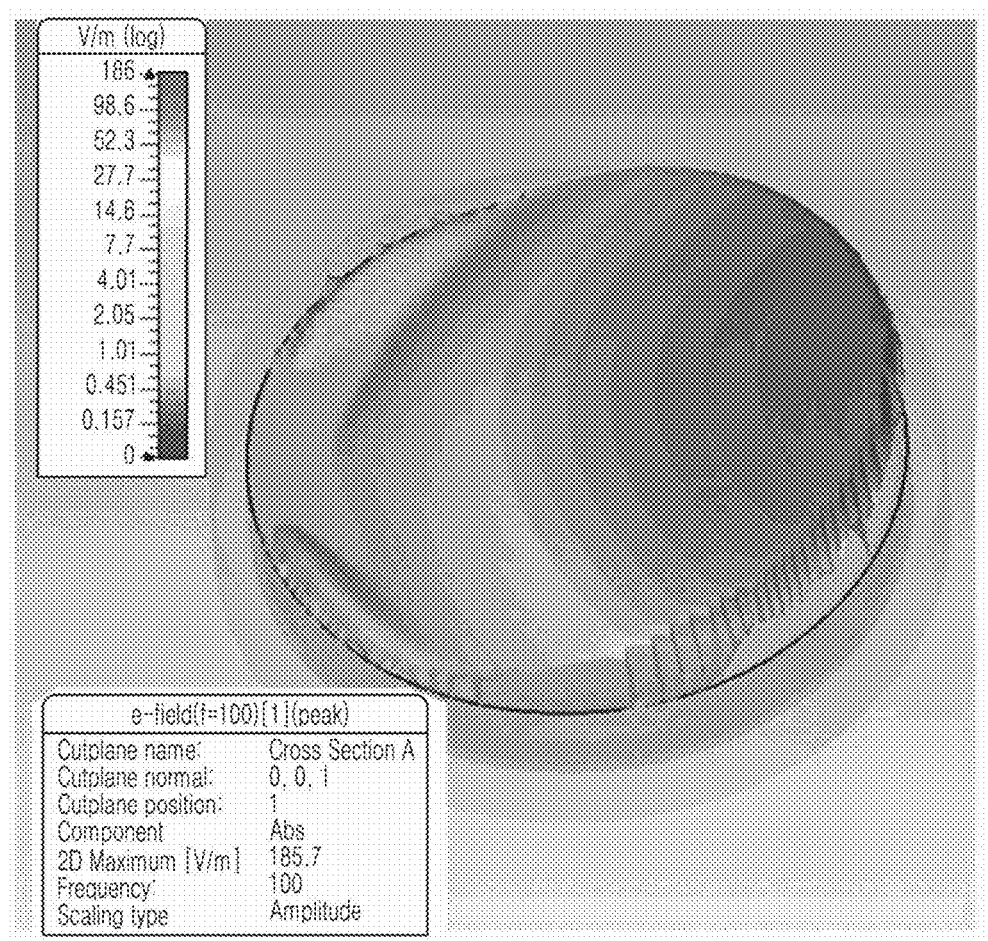
FIG. 4 is an image illustrating a simulation result for the first Comparative Example of FIG. 3.

FIGS. 3A and 3B are a front configuration diagram and a plan configuration diagram of a plasma generator model for simulating an electric field intensity distribution of a source electrode unit according to a first Comparative Example, respectively. RF power of 100 MHz is applied to a source electrode unit 42, a capacitance 43 of 300 pF is connected around the source electrode unit 42, and FIG. 4 is an image illustrating the result. As confirmed in FIG. 4, it can be seen that the power is high at a point where the capacitance is installed.

Figure 5A:
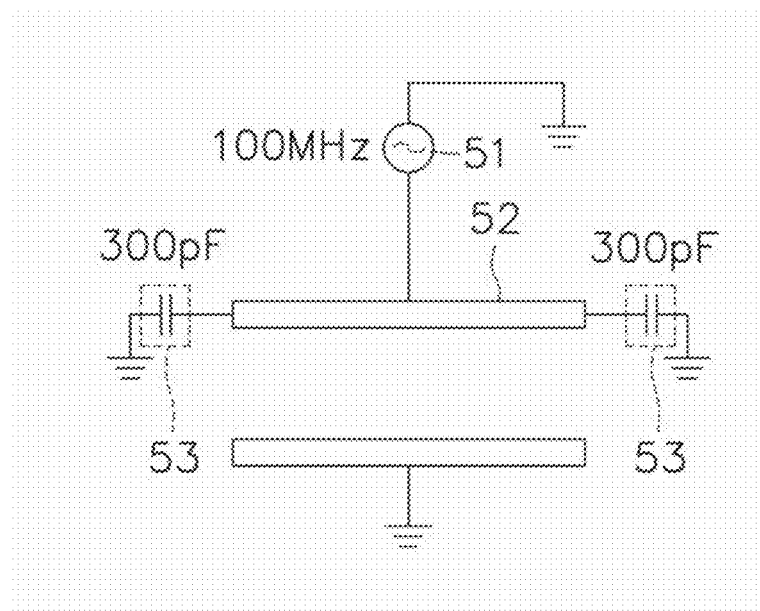
FIGS. 5A and 5B are a front configuration diagram and a plan configuration diagram of a plasma generator model for simulating an electric field intensity distribution of a source electrode unit according to a second Comparative Example, respectively.
Figure 5B:
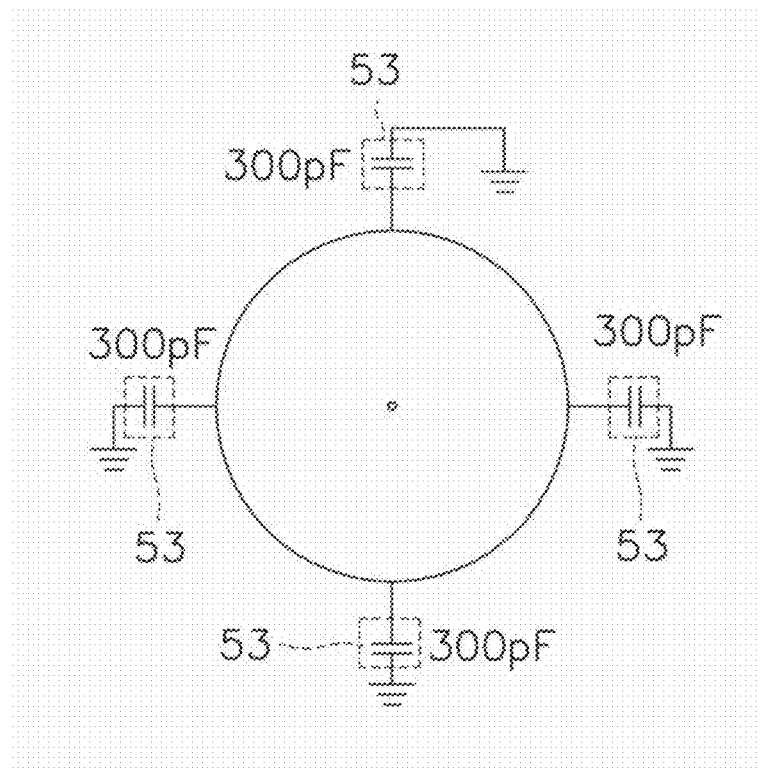
Figure 6:
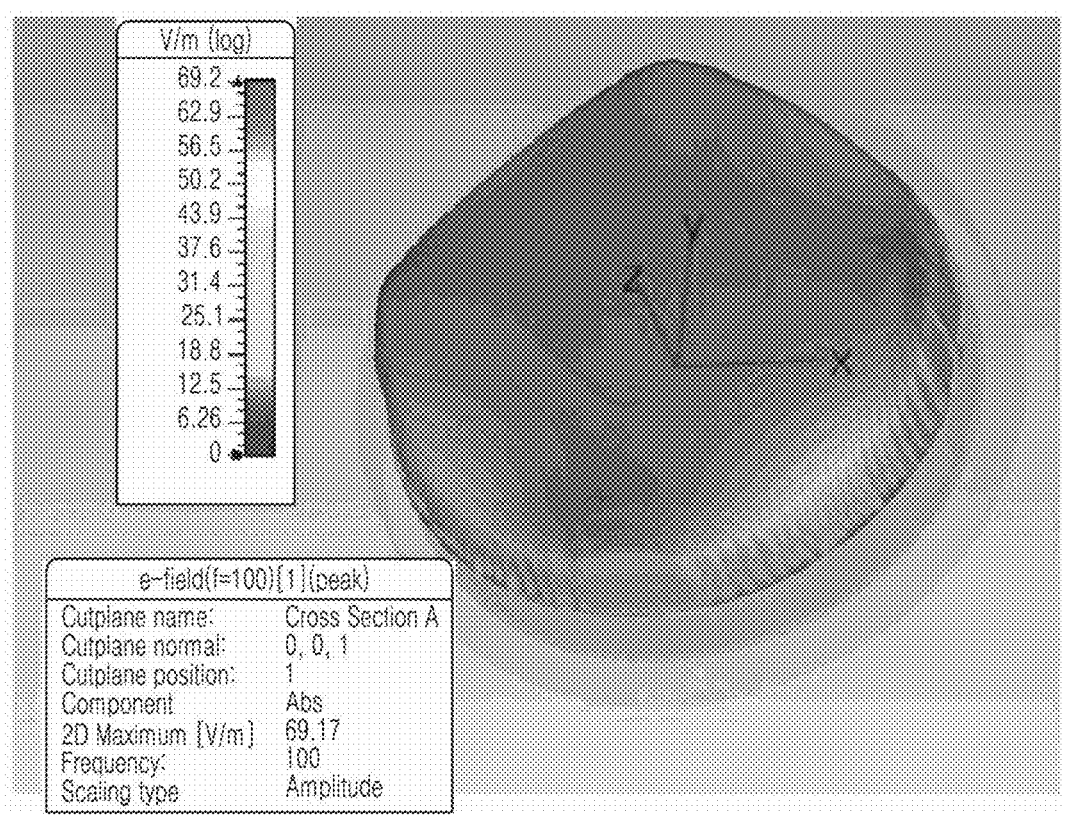
FIG. 6 is an image illustrating a simulation result for the second Comparative Example of FIG. 5.

Next, FIGS. 5A and 5B are a front configuration diagram and a plan configuration diagram of a plasma generator model for simulating an electric field intensity distribution of a source electrode unit according to a second Comparative Example, respectively. RF power of 100 MHz is applied to a source electrode unit 52, four capacitances 53 of 300 pF are connected to each other at equal angles (90°), and FIG. 6 is an image illustrating the result. As confirmed in FIG. 6, it can be seen that the power is high at four points where the capacitances are installed.

As such, it can be seen that the power is concentrated at the position where the capacitance of the source electrode unit is installed and nonuniformly distributed. Accordingly, the capacitances installed in the source electrode unit are symmetrically disposed, and further, the number of installed capacitances is increased, and as a result, a uniform electric field (that is, uniform plasma) can be implemented.

However, in order to dispose a lot of capacitances around the source electrode unit, there is a realistically spatial limitation, and further, there are problems such as an increase in manufacturing cost according to the limitation and the like.

Hereinafter, detailed exemplary embodiments of the present invention will be described with reference to the accompanying drawings.

First Exemplary Embodiment

Figure 7A:
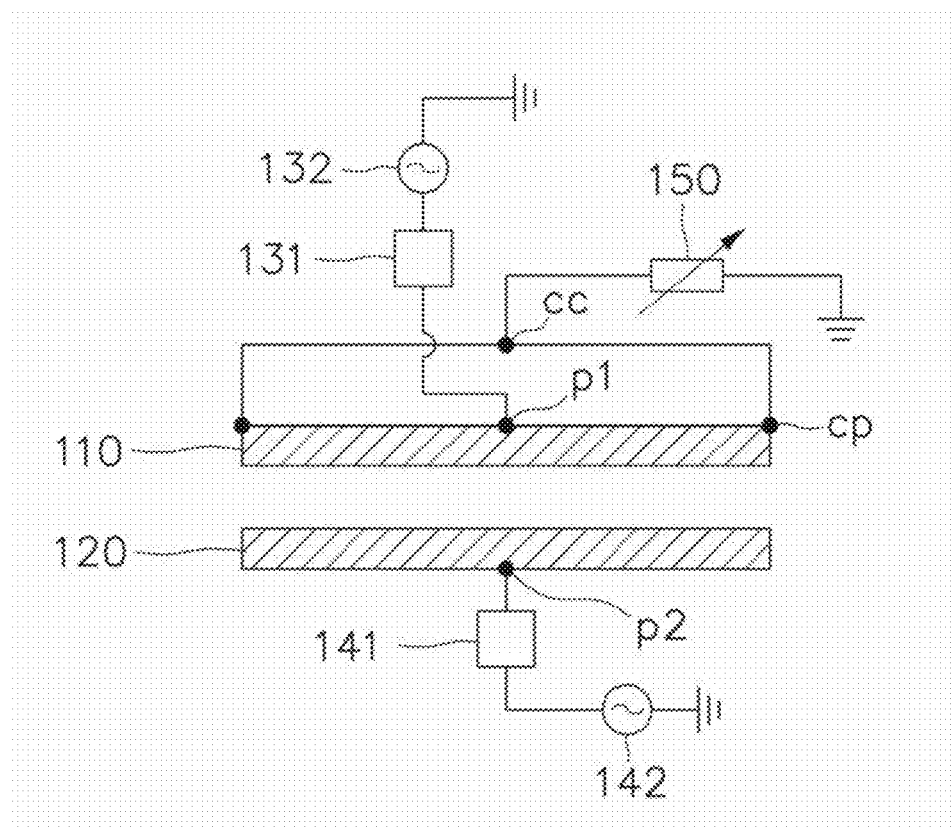
FIGS. 7A and 7B are a front configuration diagram and a plan configuration diagram of a plasma generator according to a first exemplary embodiment of the present invention, respectively.

Referring to FIG. 7, a plasma generator according to a first Example includes a planar electrode constituted by a source electrode unit 110 and a bias electrode unit 120 provided in a vacuum chamber (not illustrated), and the source electrode unit 110 is connected with an RF power unit 132 with an impedance matching unit 131 interposed therebetween, and the bias electrode unit 120 is connected with a bias RF power unit 142.

Preferably, the RF power unit 132 is connected by a first power contact point p1 of the source electrode unit 110, and in this case, the first power contact point p1 is a geometric center and more preferably, positioned at an electromagnetic impedance center.

Preferably, the bias RF power unit 142 is connected by a second power contact point p2 of the bias electrode unit 120, and in this case, the second power contact point p2 is positioned in the bias electrode unit 120.

For reference, in the present invention, the 'geometric center' is the same as a weight center under a condition where the density is uniform, and in a thin circular disk, a central rotation axis corresponds to the geometric center, and in the 'electromagnetic impedance center', it should be understood that impedances of conducting wires which are connected from a common center to respective contact points are equally designed.

The source electrode unit 110 has one common contact point cc which is connected with a plurality of contact points cp1 to cp8 by respective connection lines along the edge as a circular planar electrode and the common contact point cc is connected with an impedance controller 150. For reference, in the following description, the reference numeral of the contact point is represented by 'cp' and in the case of a need of division, a number is written together at the end of reference numeral and the contact points may be referred to as 'the first contact point cp1' and the like.

Preferably, the plurality of contact points cp1 to cp8 are disposed to be rotatably symmetrical (360°/n; n is the number of contact points) to the geometric center of the source electrode unit 110 and in the present invention, it is shown that 8 contact points are disposed at included angles of 45° along the edge of the source electrode unit 110.

Figure 7B:
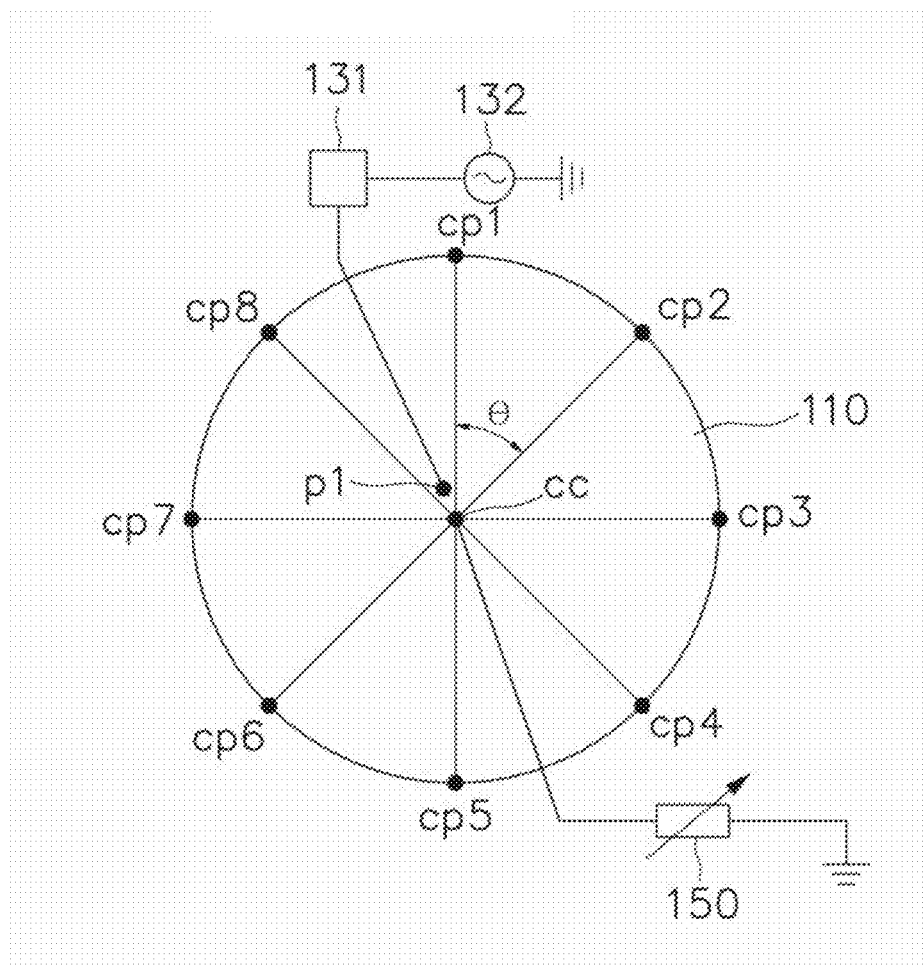

Preferably, the common contact point cc, the first power contact point p1, and the second power contact point p2 are positioned on the same vertical axis, and for reference, in FIG. 7B, in order to express the common contact point cc and the first power contact point p1 on the plane, it should be understood that the power contact point p1 is offset at the common contact point cc.

Preferably, the impedance controller 150 may control the impedance, and for example, may be provided by a variable resonance circuit in which a resistor R, an inductor L, and a capacitance C are used alone or in combination in series or in parallel.

As such, the plurality of contact points which are disposed to be rotatably symmetrical to the edge of the circular source electrode unit 110 is connected to one common contact point cc by respective connection lines and the edge of the source electrode unit 110 is equipotential, and the impedance for each contact point may be controlled by one impedance controller 150.

Figure 8:
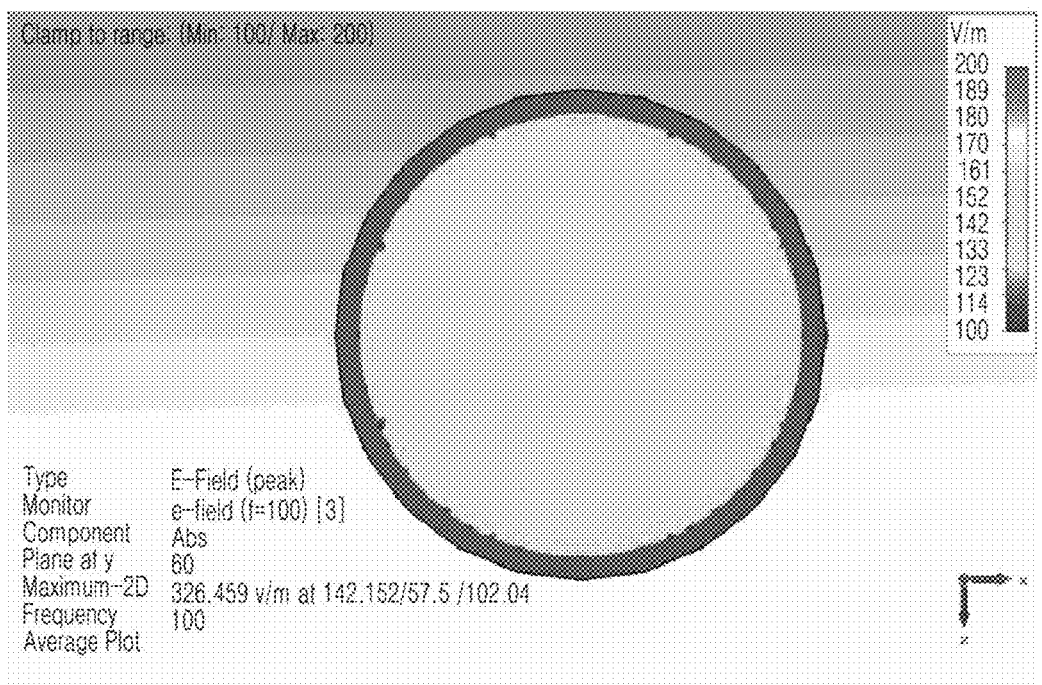
FIG. 8 is an image illustrating a simulation result for the first Example of FIG. 7.
Figure 9A:
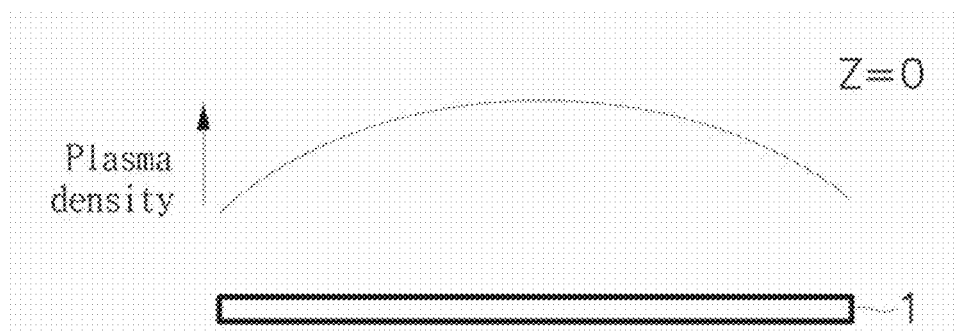
FIGS. 9A, 9B, 9C, and 9D are diagrams illustrating a plasma distribution which can be implemented by the plasma generator according to the first exemplary embodiment of the present invention.
Figure 9B:
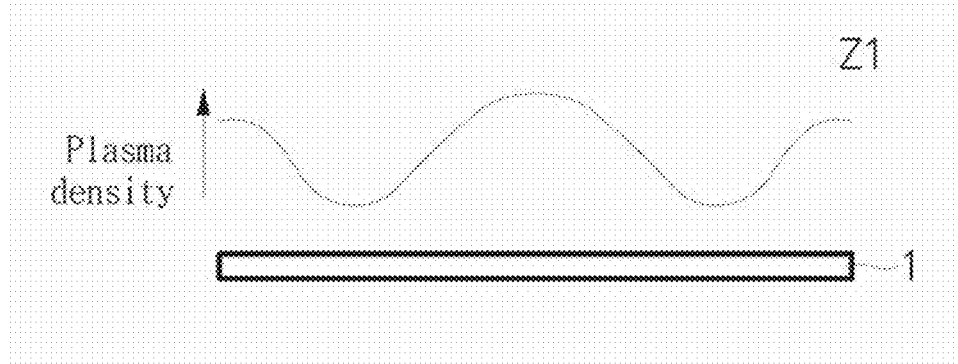
Figure 9C:
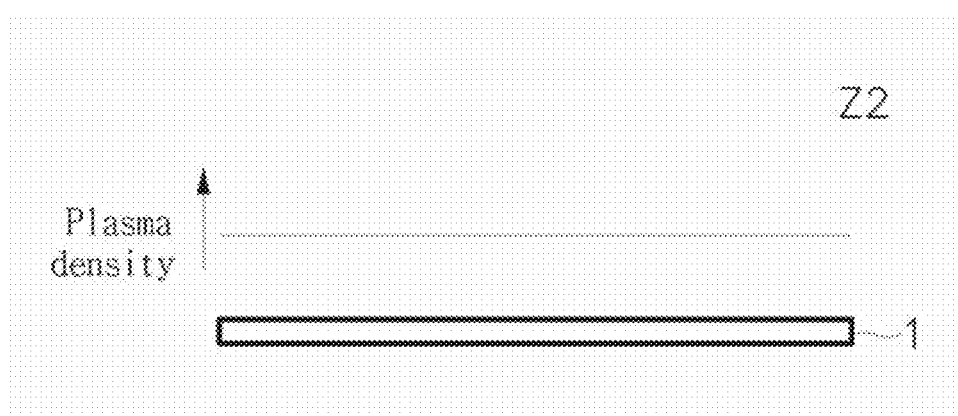
Figure 9D:
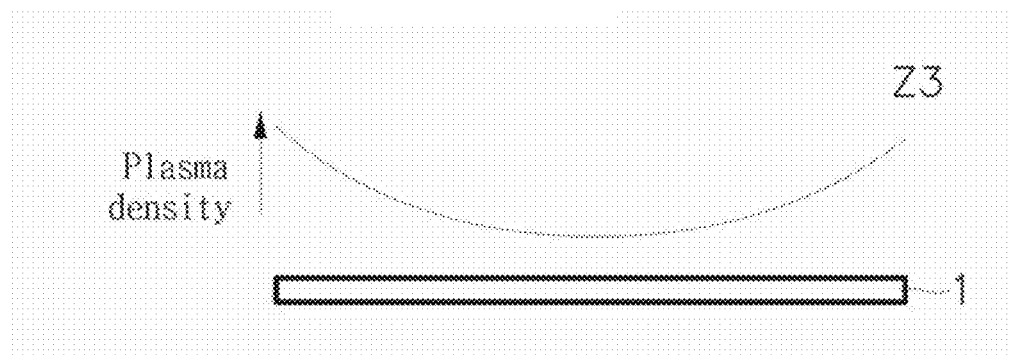

FIG. 8 is an image illustrating a simulation result of the first exemplary embodiment of FIG. 7, and is to simulate an electric field of the source electrode unit under a condition in which RF power of 100 MHz is applied and an impedance value of the impedance controller is 2400 pF. As confirmed in FIG. 8, it can be seen that a uniform electric field is generated.

FIGS. 9A, 9B, 9C, and 9D are diagrams illustrating a plasma distribution which can be implemented by the plasma generator according to the first Example of the present invention. When an impedance Z value of the impedance controller is 'zero', the density of the plasma is highly distributed at the center of the substrate 1. Alternatively, various types of plasma profiles which are rotatably symmetric to the central axis may be implemented by appropriately controlling impedances Z1, Z2, and Z3.

Second Exemplary Embodiment

Figure 10:
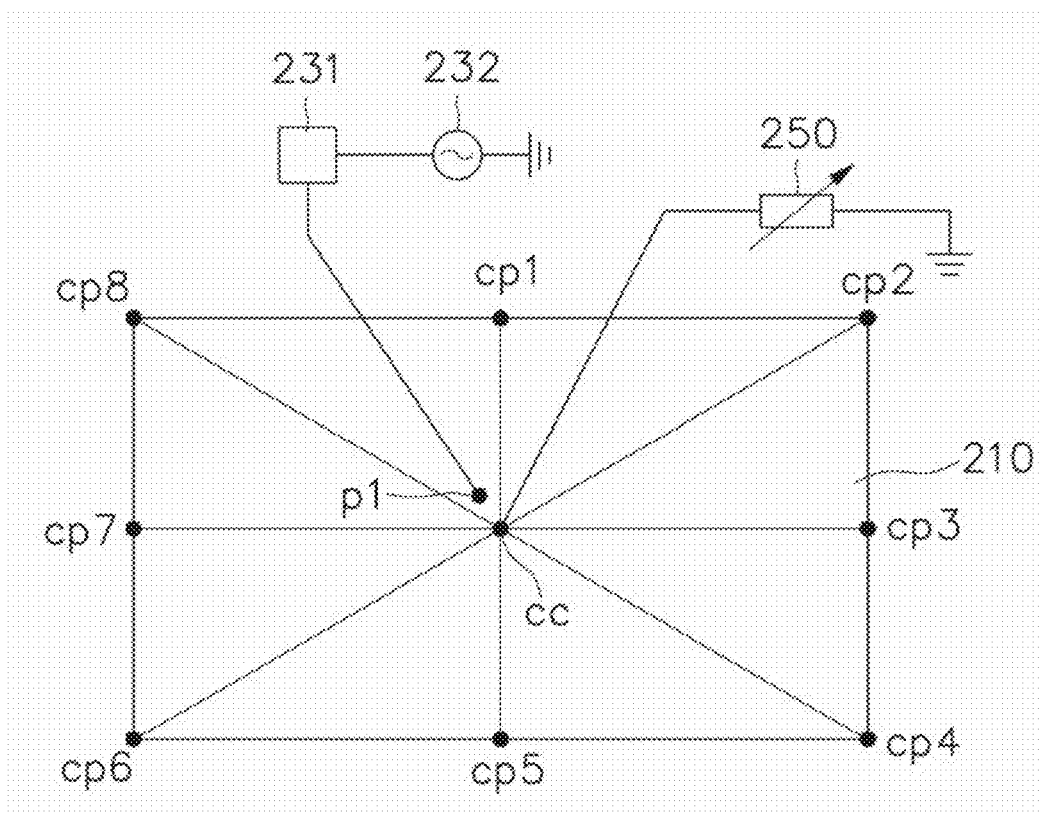
FIG. 10 is a plan configuration diagram of a plasma generator according to a second exemplary embodiment of the present invention.

FIG. 10 is a plan configuration diagram of a plasma generator according to a second exemplary embodiment of the present invention, and the duplicated description with the first exemplary embodiment is omitted and differences will be mainly described.

The plasma generator according to the second exemplary embodiment includes a rectangular planar source electrode unit 210 and has one common contact point cc which is connected with a plurality of contact points cp1 to cp8 by respective connection lines along the edge of the source electrode unit 210 and the common contact point cc is connected with an impedance controller 250. Preferably, the common contact point cc is positioned at a geometric center or an electromagnetic impedance center of the rectangular planar source electrode unit 210, and at the geometric center, an RF power unit 232 is connected to the first power contact point p1 with an impedance matching unit 231 interposed therebetween.

In the exemplary embodiment, a plurality of contact points disposed in the rectangular planar source electrode unit 210 may be constituted by a second contact point cp2, a fourth contact point cp4, a sixth contact point cp6, and an eighth contact point cp8 which are positioned at respective apexes of the source electrode unit 210 and a first contact point cp1, a third contact point cp3, a fifth contact point cp5, and a seventh contact point cp7 which are positioned at edges which are 90° rotatably symmetric to the geometric center.

As such, the contact points cp1 to cp8 disposed along the edge of the planar source electrode unit 210 are connected to each other at one common contact point cc and connected to one impedance controller 250, and as a result, the impedance values may be controlled and the impedance controller 250 may obtain various types of plasma distributions by controlling the impedance values.

Third Exemplary Embodiment

Figure 11:
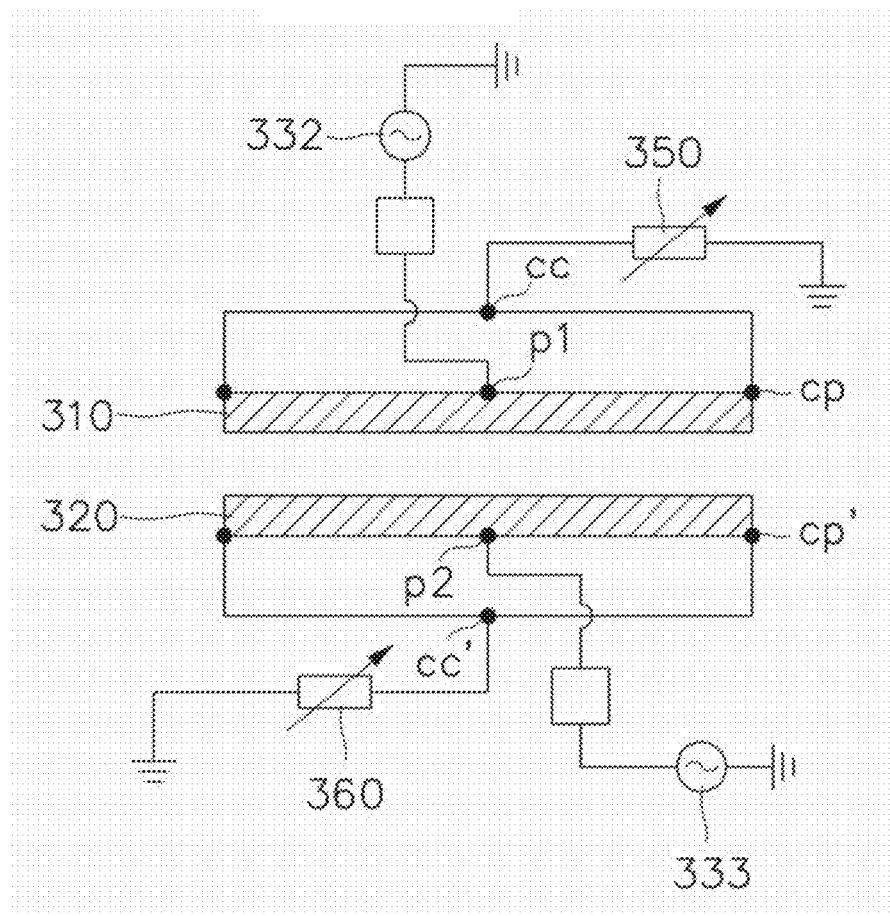
FIG. 11 is a front configuration diagram of a plasma generator according to a third exemplary embodiment of the present invention.

FIG. 11 is a front configuration diagram of a plasma generator according to a third exemplary embodiment of the present invention, and the duplicated description with the first and second exemplary embodiments is omitted and characterized differences will be mainly described.

Referring to FIG. 11, a plasma generator according to a third exemplary embodiment of the present invention includes a source electrode unit 310 having a plurality of contact points cp disposed along the edge, an impedance controller 350 connected through a common contact point cc to which the respective contact points cp are connected through connection lines, and an RF power unit 332 which is connected through a first power contact point p1 at the geometric center or the electromagnetic impedance center of the source electrode unit 310.

Meanwhile, the bias electrode unit 320 configuring a pair of planar electrodes with the source electrode unit 310 also has a plurality of second group contact points cp' along the edge, and the second group contact points cp' are connected to each other at a second common contact point cc' to be connected with a second impedance controller 360, and the edge of the bias electrode unit 320 forms an equipotential in which the impedance is controlled by a second impedance controller 360.

The bias RF power unit 333 applied to the bias electrode unit 320 is connected with a second power contact point p2 positioned at the geometric center or the electromagnetic impedance center of the bias electrode unit 320.

In the plasma generator according to the third exemplary embodiment configured as such, the impedance can be controlled by the impedance controller 350 provided in the source electrode unit 310, and further, the profile of the plasma may be more controlled by controlling the impedance of the second impedance controller 360 provided in the bias electrode unit 320.

Meanwhile, as another modified example, the source electrode unit positioned at the top is provided by high-frequency inductive coupled plasma and a plurality of contact points are disposed along the edge in the bias electrode unit 320, and the contact points are connected to each other at one common contact point to be connected with the impedance controller and thus the impedance may be controlled by only the impedance controller.

Fourth Exemplary Embodiment

Figure 12A:
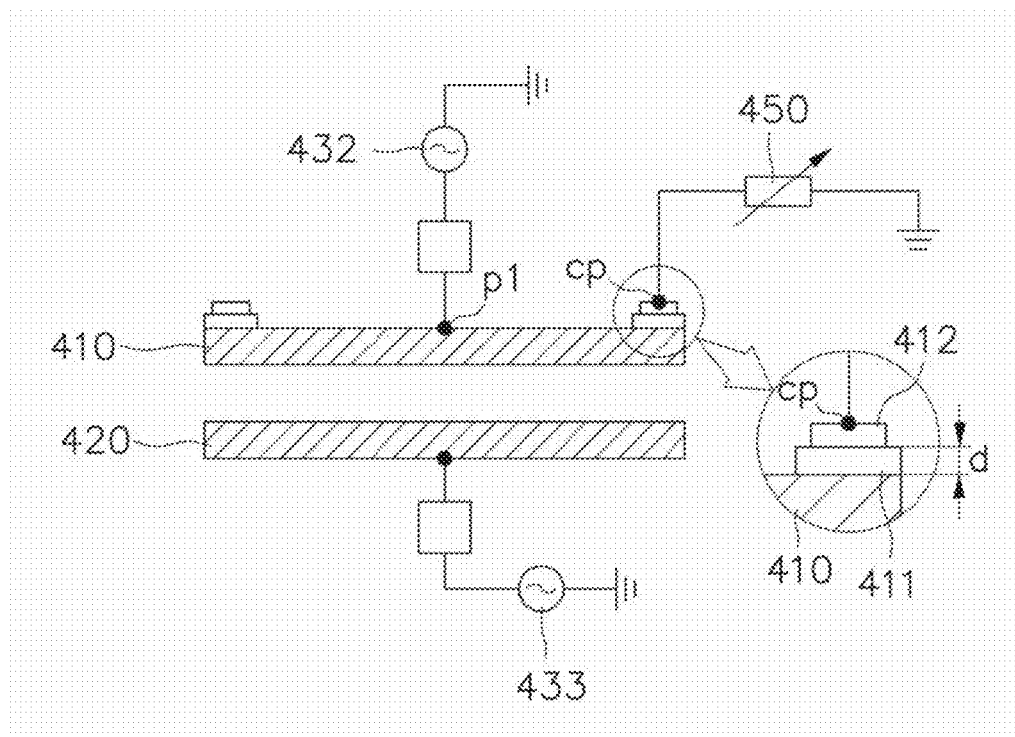
FIGS. 12A and 12B are a front configuration diagram and a plan configuration diagram of a plasma generator according to a fourth exemplary embodiment of the present invention, respectively.
Figure 12B:
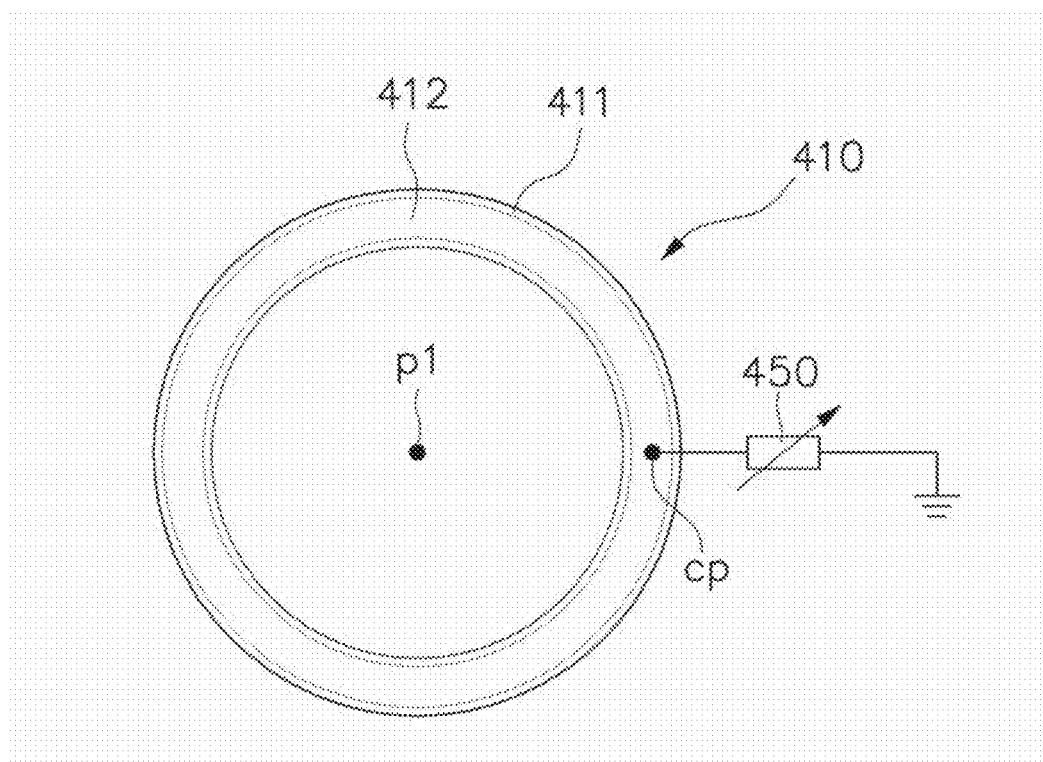

FIGS. 12A and 12B are a front configuration diagram and a plan configuration diagram of a plasma generator according to a fourth Example of the present invention, respectively. In the plasma generator according to the fourth Example of the present invention, a source electrode unit 410 includes a ring-shaped dielectric thin film layer 411 formed with a predetermined width along an upper edge and a metal layer 412 formed on the upper surface along the dielectric thin film layer 411.

The metal layer 412 is connected with an impedance controller 450 by a contact point cp.

The first power contact point p1 is positioned at the geometric center and the source electrode unit 410 is connected with an RF power unit 432.

As such, a planar capacitor constituted by the dielectric thin film layer 411 and the metal layer 412 formed in the source electrode unit 410 has a capacitance $C_d$ expressed by the following Equation 1.

$$C_d = \varepsilon \frac{A}{d} \quad \text{[Equation 1]}$$

In Equation above, $\varepsilon$ is a dielectric constant, A is an area of the metal layer, and d is a thickness (a distance between the source electrode unit and the metal layer) of the dielectric thin film layer.

In the present invention, a thickness d of the dielectric thin film layer 411 may be 0<d<2 mm.

As such, a dielectric thin film structure formed along the edge of the source electrode unit 410 forms an equipotential, and like the above exemplary embodiment, uniform plasma may be formed by the control of the impedance controller 450 or various types of plasma profiles may be implemented.

Figure 13:
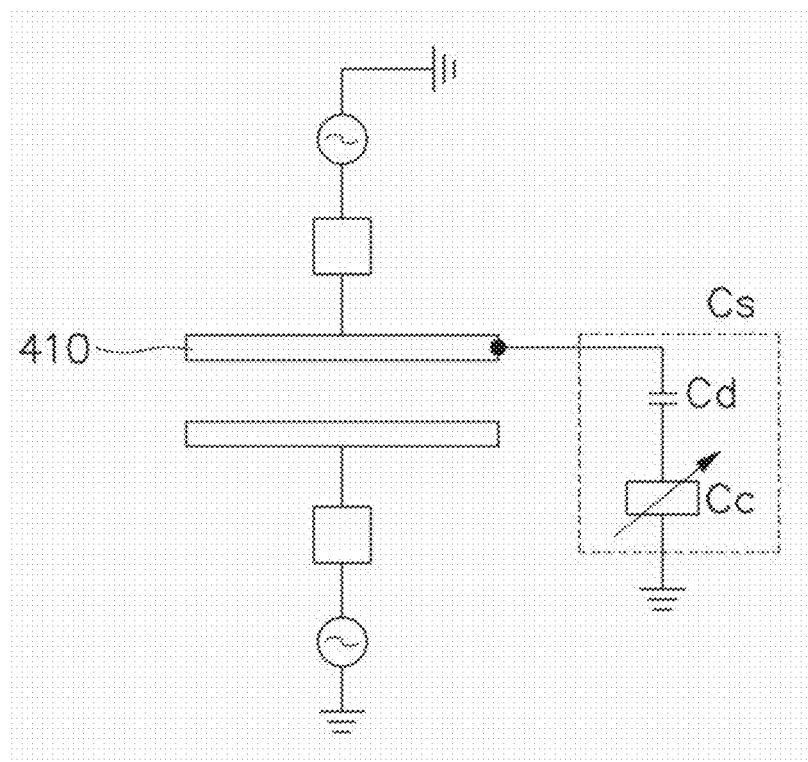
FIG. 13 is a configuration diagram for an equivalent circuit in the fourth exemplary embodiment of the present invention of FIG. 12.

FIG. 13 is a configuration diagram for an equivalent circuit in the fourth Example of the present invention of FIG. 12.

Referring to FIG. 13, an effective capacitance $C_s$ for the edge of the source electrode unit 410 is as the following Equation 2.

$$C_s = \frac{C_d \cdot C_c}{C_c + C_d} \quad \text{[Equation 2]}$$

In Equation above, $C_c$ is an impedance (capacitance) value of the impedance controller.

Meanwhile, in the case of $C_d \gg C_c$, it can be seen that $C_s \cong C_c$.

Next, as another modifiable example of the exemplary embodiment, the source electrode unit may be a rectangular planar shape (see the second exemplary embodiment and FIG. 10), and even in the bias electrode unit with the source electrode unit, equally, a planar capacitor is provided along the edge to control the impedance (see the third exemplary embodiment and FIG. 11). Alternatively, the source electrode unit positioned at the top is provided by the high-frequency inductive coupled plasma, a planar capacitor is provided along the edge of the bias electrode unit, and the planar capacitor is connected with the impedance controller, and as a result, the impedance may be controlled by only the impedance controller.

The aforementioned present invention is not limited to the aforementioned exemplary embodiments and the accompanying drawings, and it will be obvious to those skilled in the technical field to which the present invention pertains that various substitutions, modifications, and changes may be made within the scope without departing from the technical spirit of the present invention.

What is claimed is:

1. A plasma generator which includes a source electrode unit and a bias electrode unit disposed to face each other in a vacuum chamber and an RF power unit and a bias RF power unit supplying RF power to the source electrode unit and the bias electrode unit, respectively, the plasma generator comprising:
   a common contact point which is connected with a plurality of contact points disposed along the edge of the source electrode unit; and
   an impedance controller which is connected with the common contact point to control the impedance.

2. The plasma generator of claim 1, wherein the common contact point is positioned at a geometric center or an electromagnetic impedance center of the source electrode unit.

3. The plasma generator of claim 1, wherein the contact points are four or more.

4. The plasma generator of claim 1, wherein the bias electrode unit further includes a second common contact point which is connected with the plurality of second group contact points disposed along the edge; and a second impedance controller which is connected with the second common contact point to control the impedance.

5. The plasma generator of claim 1, wherein the contact points are disposed to be rotatably symmetric to the geometric center of the source electrode unit.

6. A plasma generator comprising:
   a source electrode unit and a bias electrode unit disposed to face each other in a vacuum chamber and an RF power unit and a bias RF power unit supplying RF power to the source electrode unit and the bias electrode unit, respectively,
   wherein the source electrode is inductive coupled plasma, and in the bias electrode unit, a plurality of contact points is disposed along the edge, and the contact points are connected to a common contact point which is connected with an impedance controller controlling the impedance.

7. The plasma generator of claim 6, wherein the bias RF power unit is connected by a power contact point positioned at a geometric center of the bias electrode unit.

8. The plasma generator of claim 6, wherein the contact points are disposed to be rotatably symmetric to the geometric center of the bias electrode unit.

9. The plasma generator of claim 1, wherein the RF power is supplied to the source electrode at a first power contact point.

10. The plasma generator of claim 9, wherein the common contact point, the first power contact point and a second power point at the bias electrode are positioned on the same vertical axis.

11. The plasma generator of claim 1, wherein RF power is supplied to the bias electrode at a second power contact point.

12. The plasma generator of claim 6, wherein bias RF power is supplied to the bias electrode at power contact point.

13. The plasma generator of claim 1, wherein an impedance matching unit is interposed between the RF power unit and the source electrode.

14. The plasma generator of claim 6, wherein an impedance matching unit is interposed between the bias RF power unit and the bias electrode.

* * * * *